United States Patent
Kaimori et al.

(10) Patent No.: US 9,181,464 B2
(45) Date of Patent: Nov. 10, 2015

(54) ADHESIVE RESIN COMPOSITIONS, AND LAMINATES AND FLEXIBLE PRINTED WIRING BOARDS USING SAME

(75) Inventors: Shingo Kaimori, Osaka (JP); Jun Sugawara, Osaka (JP); Akira Mizoguchi, Osaka (JP); Syougo Asai, Kouga (JP); Takuma Yoshisaka, Kouga (JP); Naota Uenishi, Kouga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 13/203,216

(22) PCT Filed: Jan. 18, 2010

(86) PCT No.: PCT/JP2010/050481
§ 371 (c)(1),
(2), (4) Date: Aug. 24, 2011

(87) PCT Pub. No.: WO2010/098154
PCT Pub. Date: Sep. 2, 2010

(65) Prior Publication Data
US 2011/0305883 A1    Dec. 15, 2011

(30) Foreign Application Priority Data

Feb. 24, 2009    (JP) .................................. 2009-040579

(51) Int. Cl.
*B32B 3/10*    (2006.01)
*B32B 7/12*    (2006.01)
(Continued)

(52) U.S. Cl.
CPC ............. *C09J 167/00* (2013.01); *C08G 59/304* (2013.01); *C08G 59/3272* (2013.01);
(Continued)

(58) Field of Classification Search
USPC ........................................ 428/195.1; 3/195.1
See application file for complete search history.

(56) References Cited

U.S. PATENT DOCUMENTS 2,589,245 A * 3/1952 Greenlee ......................... 528/95
6,900,269 B2   5/2005 Hwang et al.
(Continued)

FOREIGN PATENT DOCUMENTS

CN    1667073 A    9/2005
CN    1891778 A    1/2007
(Continued)

OTHER PUBLICATIONS

Machine translation of Kitamura et al., JP2008239675A.*
(Continued)

*Primary Examiner* — Mark Ruthkosky
*Assistant Examiner* — Ian Rummel
(74) *Attorney, Agent, or Firm* — McDermott Will & Emery LLP

(57) ABSTRACT

Provided are an adhesive resin composition that is halogen-free, has good adhesiveness, solder heat resistance, and flame retardancy, and has good flow characteristics, and a laminate and a flexible printed wiring board using the same. The adhesive resin composition contains a phosphorus-containing epoxy resin and/or a phosphorus-containing phenoxy resin, a phosphorus-containing polyester resin having a weight-average molecular weight of more than 20,000 and 150,000 or less, another thermoplastic resin, and a curing agent. The adhesive resin composition preferably further contains a benzoxazine compound. Preferably, substantially no inorganic filler is mixed in the adhesive resin composition.

5 Claims, 1 Drawing Sheet

(51) Int. Cl.
*C09J 7/02* (2006.01)
*C09J 167/02* (2006.01)
*C09J 163/04* (2006.01)
*C09J 171/10* (2006.01)
*C09J 163/02* (2006.01)
*C09J 177/00* (2006.01)
*C09J 161/14* (2006.01)
*C09J 167/00* (2006.01)
*C08G 59/30* (2006.01)
*C08G 59/32* (2006.01)
*C09J 163/00* (2006.01)
*C09J 171/00* (2006.01)
*H05K 3/38* (2006.01)
*C08K 5/3437* (2006.01)
*C08L 67/00* (2006.01)
*C08L 77/00* (2006.01)
*C08L 79/04* (2006.01)
*H05K 1/03* (2006.01)

(52) U.S. Cl.
CPC ............ *C09J 7/0242* (2013.01); *C09J 163/00* (2013.01); *C09J 171/00* (2013.01); *H05K 3/386* (2013.01); *C08G 2650/56* (2013.01); *C08K 5/3437* (2013.01); *C08L 67/00* (2013.01); *C08L 77/00* (2013.01); *C08L 79/04* (2013.01); *C09J 2203/326* (2013.01); *C09J 2205/102* (2013.01); *C09J 2461/00* (2013.01); *C09J 2463/00* (2013.01); *C09J 2467/00* (2013.01); *C09J 2477/00* (2013.01); *H01L 2924/00013* (2013.01); *H05K 1/0393* (2013.01); *H05K 2201/012* (2013.01); *H05K 2201/0145* (2013.01); *Y10T 428/24802* (2015.01); *Y10T 428/287* (2015.01)

(56) References Cited

U.S. PATENT DOCUMENTS

| | | | |
|---|---|---|---|
| 7,084,194 B2 | 8/2006 | Hwang et al. | |
| 2006/0173101 A1* | 8/2006 | Takahata et al. | 523/223 |
| 2006/0234044 A1* | 10/2006 | Nakanishi et al. | 428/344 |
| 2006/0234045 A1 | 10/2006 | Nakanishi et al. | |
| 2007/0003763 A1* | 1/2007 | Kamo et al. | 428/411.1 |
| 2008/0289860 A1* | 11/2008 | Kita et al. | 174/254 |

FOREIGN PATENT DOCUMENTS

| | | | |
|---|---|---|---|
| JP | 2001-288339 A | | 10/2001 |
| JP | 2002-003588 | | 1/2002 |
| JP | 2003/176470 | | 6/2003 |
| JP | 2005/053989 | | 3/2005 |
| JP | 2005-053989 A | | 3/2005 |
| JP | 2005053989 A | * | 3/2005 |
| JP | 2005-248048 A | | 9/2005 |
| JP | 2006-045322 | | 2/2006 |
| JP | 2007-002113 A | | 1/2007 |
| JP | 2007-254659 | | 10/2007 |
| JP | 2007-254659 A | | 10/2007 |
| JP | 2007-314742 | | 12/2007 |
| JP | 2008-055882 | | 3/2008 |
| JP | 2008056820 A | * | 3/2008 |
| JP | 2003-176470 | | 7/2008 |
| JP | 4109863 B2 | | 7/2008 |
| JP | 2008-231195 | | 10/2008 |
| JP | 2008-231195 A | | 10/2008 |
| JP | 2008-231287 | | 10/2008 |
| JP | 2008-231287 A | | 10/2008 |
| JP | 2008-239675 | | 10/2008 |

OTHER PUBLICATIONS

U.S. Appl. No. 13/203,209, filed Aug. 24, 2011.
Chinese Office Action, w/ English translation thereof, issued in Chinese Patent Application No. CN 201080009138.8 dated Jan. 4, 2013.
Chinese Office Action, w/ English translation thereof, issued in Chinses Patent Application No. CN 201080009146.2 dated Jan. 10, 2013.
United States Office Action issued in U.S. Appl. No. 13/203,209 dated Jul. 3, 2013.
Japanese Notification of Reasons for Rejection, w/ English translation thereof, issued in Japanese Patent Application No. JP 2009-040579 dated Jul. 10, 2013.
Japanese Notification of Reasons for Rejection, w/ English translation thereof, issued in Japanese Patent Application No. JP 2009-040558 dated Jul. 16, 2013.
Notification of First Office Action dated Jan. 4, 2013 for corresponding Chinese Patent Application and its English translation.
United States Office Action issued in U.S. Appl. No. 13/203,209 dated Oct. 10, 2013.
Advisory Action issued in U.S. Appl. No. 13/203,209 dated Dec. 26, 2013.
Examiner's Answer in Response to the Appeal Brief, issued in U.S. Appl. No. 13/203,209 dated May 13, 2014.
Notification of Fifth Office Action dated Jul. 21, 2015 issued in Chinese Patent Application No. 201080009146.2 (English translation thereof).

* cited by examiner

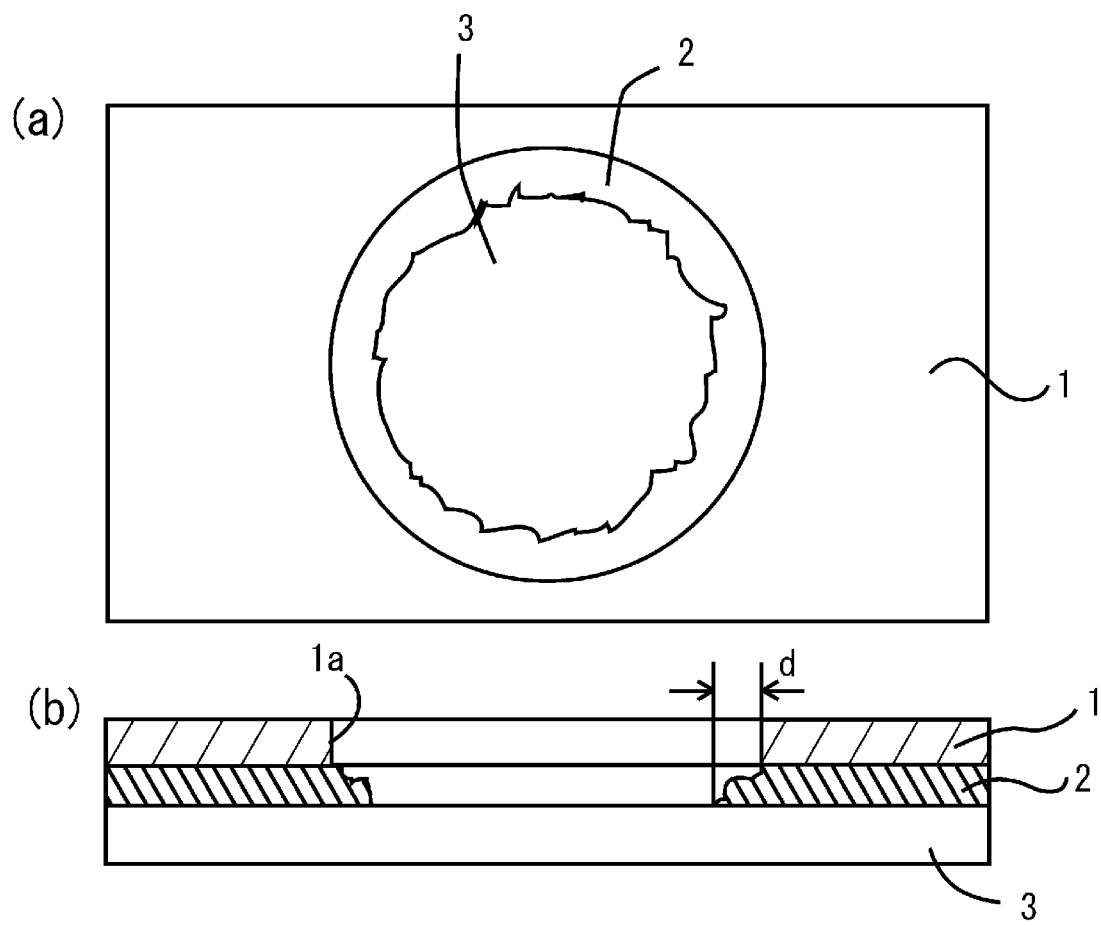

ADHESIVE RESIN COMPOSITIONS, AND LAMINATES AND FLEXIBLE PRINTED WIRING BOARDS USING SAME

RELATED APPLICATIONS

This application is the U.S. National Phase under 35 U.S.C. §371 of International Application No. PCT/JP2010/050481, filed on Jan. 18, 2010, which in turn claims the benefit of Japanese Application No. 2009-040579, filed on Feb. 24, 2009, the disclosures of which Applications are incorporated by reference herein.

TECHNICAL FIELD

The present invention relates to an adhesive resin composition suitable for use in a flexible printed wiring board such as a flexible copper clad laminate, and a flexible printed wiring board and a laminate such as an adhesive sheet or a coverlay film using the same.

BACKGROUND ART

In general, flexible printed wiring boards (flexible printed circuit boards) have a basic structure in which a copper foil or the like is bonded with an adhesive to one surface or both surfaces of an insulating film functioning as a base, the insulating film being composed of a heat-resistant film such as a polyimide film. As such an adhesive, hitherto, an adhesive obtained by mixing a flame retardant with a blend resin of a thermosetting resin such as an epoxy resin and a thermoplastic resin such as an acrylic resin, a polyamide, or a polyester resin has been used.

As the flame retardant, halogen flame retardants have been hitherto used because high flame retardancy corresponding to the VTM-0 class or the V-0 class in the Underwriters Laboratories Inc. (UL)-94 standard is required. Recently, however, in view of the problems of environmental pollution, phosphorus flame retardants such as phosphoric acid esters, phosphoric acid ester amides, melamine polyphosphate, ammonium polyphosphate, 9,10-dihydro-9-oxa-10-phosphaphenanthrene-10-oxide and derivatives thereof, and phosphazene compounds have been used instead of the halogen flame retardants.

However, in order to satisfy high flame retardancy corresponding to the VTM-0 class or the V-0 class in the UL-94 standard by using only such phosphorus flame retardants, it is necessary to mix a large amount of a phosphorus flame retardant as compared with the case where a halogen flame retardant is used. This results in a problem that, with an increase in the amount of phosphorus flame retardant mixed, the adhesiveness decreases.

In order to solve this problem, recently, it has been proposed that the amount of phosphorus flame retardant mixed be reduced by using a resin that utilizes a flame retardant effect of phosphorus.

For example, PTL 1 (Japanese Unexamined Patent Application Publication No. 2003-176470) has proposed that the phosphorus content in a composition is controlled to be 2% by weight or more by using a phosphorus-containing epoxy resin and further using a phosphorus-containing phenoxy resin as a portion of a thermoplastic resin.

In addition, PTL 2 (Japanese Unexamined Patent Application Publication No. 2005-53989) discloses a flame-retardant adhesive resin composition containing a blend resin of a halogen-free epoxy resin and a phosphorus-containing polyester resin, a phosphazene compound functioning as a flame retardant, and inorganic filler such as magnesium hydroxide or aluminum hydroxide. It is described that flame retardancy and solder heat resistance can be satisfied by controlling a content ratio of phosphorus element to the resin component to be in the range of 1.8% to 5% by weight even without using a phosphoric acid ester. Also, PTL 2 describes that a phosphorus-containing polyester resin having a weight-average molecular weight of 10,000 to 50,000 can be used, and discloses Examples in which VYLON 537 (weight-average molecular weight: 140,000) and VYLON 237 (weight-average molecular weight: 30,000) manufactured by Toyobo Co., Ltd are used.

Furthermore, PTL 3 (Japanese Unexamined Patent Application Publication No. 2007-254659) has proposed an adhesive resin composition for a flexible printed wiring board, the adhesive resin composition containing a blend resin of a phosphorus-containing epoxy resin and a thermoplastic resin having a solubility parameter of 8 to 16 and, as a flame retardant, a phosphorus-containing polyester resin that has a weight-average molecular weight of 2,000 to 20,000 and that is soluble in an organic solvent. PTL 3 discloses that a sufficient adhesive force can be ensured by using the phosphorus-containing polyester resin having a weight-average molecular weight of 2,000 to 20,000 without impairing solder heat resistance and flame retardancy, as compared with the case where a phosphoric acid ester flame retardant or a phosphoric acid ester amide flame retardant is used. It is described that, on the other hand, a phosphorus-containing polyester resin having a weight-average molecular weight exceeding 20,000 has poor solvent solubility.

CITATION LIST

Patent Literature

PTL 1: Japanese Unexamined Patent Application Publication No. 2003-176470
PTL 2: Japanese Unexamined Patent Application Publication No. 2005-53989
PTL 3: Japanese Unexamined Patent Application Publication No. 2007-254659

SUMMARY OF INVENTION

Technical Problem

As described above, various halogen-free adhesive resin compositions for a flexible printed wiring board, the halogen-free adhesive resin compositions having good adhesiveness, flame retardancy, and solder heat resistance, have been proposed. In a flexible printed wiring board, for the purpose of providing electrical connection between layers or electrical connection to the outside, a hole is formed in a portion of an insulating film and an adhesive layer that cover a metal foil so as to expose the metal, and the metal is used as a connection terminal. When a coverlay having a hole for forming a terminal is bonded to a metal layer by hot pressing, if an adhesive is softened and fluidized and exudes into the hole, electrical connection is impaired. Accordingly, it is necessary that the adhesive does not flow during the hot pressing, that is, it is necessary for the adhesive to have good flow characteristics. In addition, with a recent demand for high-density mounting, the diameter of such terminals has tended to decrease. The smaller the terminal diameter, the larger the influence of an adhesive exuding into a hole on the electrical connection. Thus, it is desired that the adhesive have better flow characteristics.

The present invention has been made in view of the above circumstance. An object of the present invention is to provide an adhesive resin composition that is halogen-free, has good adhesiveness, solder heat resistance, and flame retardancy, and has good flow characteristics, and a laminate and a flexible printed wiring board using the same.

Solution to Problem

An adhesive resin composition of the present invention contains (a) a phosphorus-containing epoxy resin and/or a phosphorus-containing phenoxy resin, (b) a phosphorus-containing polyester resin having a weight-average molecular weight of more than 20,000 and 150,000 or less, preferably more than 20,000 and 50,000 or less, (c) another thermoplastic resin, and (d) a curing agent.

The another thermoplastic resin is preferably a polyamide, and in particular, a polyamide having a reactive group that reacts with an epoxy group.

The adhesive resin composition of the present invention preferably further contains a benzoxazine compound in an amount of 5 to 25 parts by mass per 100 parts by mass of the resins. Preferably, substantially no inorganic filler is mixed in the adhesive resin composition of the present invention.

An adhesive resin composition of the present invention can be prepared so that when an adhesive layer composed of the adhesive resin composition of the present invention described above is formed on a base film, the adhesive layer is laminated with a metal foil, and the resulting laminate is heated and pressed at 160° C. at 3 MPa/cm$^2$ for 40 minutes, an overflow of the adhesive resin composition from at least a portion of an outer peripheral end surface orthogonal to a lamination surface laminated with the metal foil is 0.2 mm or less.

A laminate of the present invention includes a base film and an adhesive layer disposed on the base film and composed of the adhesive resin composition of the present invention. A flexible printed wiring board of the present invention includes the laminate.

Advantageous Effects of Invention

The adhesive resin composition of the present invention contains a phosphorus-containing epoxy resin and/or a phosphorus-containing phenoxy resin, a phosphorus-containing polyester resin having a specific weight-average molecular weight, and another thermoplastic resin. Therefore, flow characteristics can be satisfied without impairing flame retardancy, adhesiveness, and solder heat resistance.

BRIEF DESCRIPTION OF DRAWINGS

FIGURE includes views illustrating a method for measuring flow characteristics ((a) is a top view, and (b) is a cross-sectional view).

DESCRIPTION OF EMBODIMENTS

Embodiments of the present invention will now be described. However, it is to be understood that the embodiments disclosed herein are illustrative in all respects and are not restrictive. It is intended that the scope of the present invention is defined by the description of Claims and includes equivalents of the description in Claims and all modifications within the scope of Claims.

[Adhesive Resin Composition]

First, an adhesive resin composition of the present invention will be described.

The adhesive resin composition of the present invention contains (a) a phosphorus-containing epoxy resin and/or a phosphorus-containing phenoxy resin; (b) a phosphorus-containing polyester resin having a weight-average molecular weight of more than 20,000 and 150,000 or less, (c) another thermoplastic resin; and (d) a curing agent. The components will now be described in order.

(a) Phosphorus-Containing Epoxy Resin and/or Phosphorus-Containing Phenoxy Resin The adhesive resin composition of the present invention contains a phosphorus-containing epoxy resin and/or a phosphorus-containing phenoxy resin.

The phosphorus-containing epoxy resin used in the present invention is a resin in which a phosphorus atom is bonded to an epoxy resin using a reactive phosphorus compound. The epoxy resin is a resin having at least two epoxy groups in one molecule. Examples thereof include bisphenol A type epoxy resins, bisphenol F type epoxy resins, glycidyl ether type epoxy resins, glycidyl ester type epoxy resins, glycidylamine type epoxy resins, novolac type epoxy resins, and cresol novolac type epoxy resins. Examples of epoxy resins having a high-molecular weight and classified as phenoxy resins also include similar such resins. From the standpoint of compatibility with other resins, phosphorus-containing epoxy resins are preferably used rather than phosphorus-containing phenoxy resins.

The phosphorus-containing epoxy resins and the phosphorus-containing phenoxy resins described above may be used alone or in combination of two or more resins. A phosphorus-containing epoxy resin and a phosphorus-containing phenoxy resin may be mixed and used. Furthermore, in addition to the phosphorus-containing epoxy resins and/or the phosphorus-containing phenoxy resins, another phosphorus-containing thermosetting resin or a phosphorus-free thermosetting resin may be added and mixed. From the standpoint of compatibility with a thermoplastic resin and an adhesive strength to a base to be bonded, a phosphorus-free epoxy resin is preferably contained.

Commercially available phosphorus-containing epoxy resins and phosphorus-containing phenoxy resins may be used. Examples thereof include FX289, FX305, and ERF001 manufactured by Tohto Kasei Co., Ltd., and EPICLON EXA-9710 manufactured by DIC Corporation.

(b) Phosphorus-Containing Polyester Resin and (c) Another Thermoplastic Resin

The adhesive resin composition of the present invention contains a blend resin of a phosphorus-containing polyester resin and another thermoplastic resin.

The phosphorus-containing polyester resin used in the present invention is a polyester resin containing a phosphorus atom in the main chain thereof and having a weight-average molecular weight of more than 20,000 and 150,000 or less. If the weight-average molecular weight of the phosphorus-containing polyester resin is too low, the resin is softened by heating and easily flows. On the other hand, if the weight-average molecular weight of the phosphorus-containing polyester resin is too high, compatibility with the other thermoplastic resin and thermosetting resins such as an epoxy resin and a phenoxy resin decreases. Consequently, homogeneity of the adhesive resin composition decreases, and furthermore, the adhesiveness and flame retardancy tend to decrease. Phosphorus-containing epoxy resins and/or phosphorus-containing phenoxy resins tend to have poor compatibility, as compared with normal epoxy resins. Therefore, a phosphorus-containing polyester resin having a weight-average molecular weight of 50,000 or less is preferably used.

The phosphorus-containing polyester resin can be synthesized by using a diol and a multivalent carboxylic acid containing phosphorus in the molecules thereof. For example, the phosphorus-containing polyester resin can be synthesized by employing a method described in Japanese Unexamined Patent Application Publication No. 2007-254659 or 2002-3588. Commercially available phosphorus-containing polyester resins may also be used. Examples of the commercially available phosphorus-containing polyester resins include VYLON 237, 337, 537, and 637, and UR3570, all of which are manufactured by Toyobo Co., Ltd.

The content of the phosphorus-containing polyester resin in the thermoplastic resin is preferably 20% to 60% by mass, and more preferably 30% to 50% by mass. If the content of the phosphorus-containing polyester resin in the thermoplastic resin is too low, flame retardancy cannot be satisfied. On the other hand, if the content of the phosphorus-containing polyester resin is too high, the homogeneity of the adhesive resin composition decreases and adhesiveness and flame retardancy tend to decrease because compatibility between the phosphorus-containing polyester resin and an epoxy resin is not very good.

Examples of the other thermoplastic resin, that is, examples of a thermoplastic resin other than the phosphorus-containing polyester resin include phosphorus-free polyester resins, phosphorus-containing or phosphorus-free acrylic resins, polystyrene resins, polyamide resins, polyamideimide resins, polyester resins, polycarbonate resins, polyphenylene oxide resins, polyphenylene sulfide resins (such as polyphenylene sulfide, polyphenylene sulfide ketone, and polyphenylene sulfide sulfone), polysulfone resins (such as polysulfone and polyethersulfone), polyetherimide resins (such as poly(N-formylethyleneimine) resins), polyetheretherketone resins, polyacetal resins (such as polyoxymethylene resins), and ketone resins (such as aliphatic polyketone resins, acetone formaldehyde resins, furfural acetone resins, and cyclic ketone resins). These thermoplastic resins may be used alone or in combination of two or more resins.

Among these thermoplastic resins, as the other thermoplastic resin, phosphorus-free thermoplastic resins are preferable, and polyamide resins are more preferable in view of compatibility with the phosphorus-containing polyester resin and the phosphorus-containing epoxy resin.

From the standpoint of flow characteristics, polyamide resins having a reactive group that reacts with an epoxy group are preferably used. Examples of the reactive group include an epoxy group, a carboxyl group, a hydroxyl group, and an amino group. The sum of the acid value and the amine value is preferably 3 or more and 100 or less. The reason for this is as follows. When the sum of the acid value and the amine value is less than 3, reactivity with an epoxy group is not sufficient. When the sum of the acid value and the amine value is more than 100, the reactivity is too strong, and the pot life of the resulting adhesive becomes short. Furthermore, it is desirable that the acid value be larger than the amine value because the pot life of the adhesive is long.

The polyamide resin can be synthesized by a reaction of a dicarboxylic acid, a diamine, an aminocarboxylic acid, a lactam, and the like. The reaction is not limited to a reaction between one dicarboxylic acid and one diamine. Alternatively, the polyamide resin may be synthesized by using a plurality of dicarboxylic acids and a plurality of diamines.

Examples of the dicarboxylic acid include terephthalic acid, isophthalic acid, orthophthalic acid, naphthalene dicarboxylic acids (1,5-, 2,5-, 2,6-, and 2,7-isomers), biphenyl dicarboxylic acids (2,2'-, 3,3'-, and 4,4'-isomers), 4,4'-diphenyl ether dicarboxylic acid, 4,4'-diphenyl methane dicarboxylic acid, 4,4'-diphenyl sulfone dicarboxylic acid, 1,2-bis(phenoxy)ethane-4,4'-dicarboxylic acid, anthracenedicarboxylic acid (2,5- and 2,6-isomers), phenylene diacetic acids (o-, m-, and p-isomers), phenylene dipropionic acids (o-, m-, and p-isomers), phenylmalonic acid, phenylglutaric acid, diphenylsuccinic acid, oxalic acid, malonic acid, succinic acid, glutaric acid, adipic acid, sebacic acid, decanedicarboxylic acid, maleic acid, fumaric acid, itaconic acid, 1,3-cyclobutanedicarboxylic acid, 1,3-cyclopentane dicarboxylic acid, 1,4-cyclohexane dicarboxylic acid, 1,2-cyclohexane dicarboxylic acid, 1,3-(dicarboxymethyl)cyclohexane, 1,4-(dicarboxymethyl)cyclohexane, dicyclohexyl-4,4'-dicarboxylic acid, and dimer acids.

Examples of the diamine include hexamethylenediamine, heptamethylenediamine, 1,4-bis(aminomethyl)cyclohexane, bis(p-aminocyclohexyl)methane, m-xylenediamine, 1,4-bis(3-aminopropoxy)cyclohexane, piperazine, and isophorone diamine.

Examples of the aminocarboxylic acid include 11-aminoundecanoic acid, 12-aminododecanoic acid, 4-aminomethylbenzoic acid, 4-aminomethylcyclohexanecarboxylic acid, 7-aminoenanthic acid, and 9-aminononanoic acid.

Examples of the lactam include ε-caprolactam, ω-lauryllactam, α-pyrrolidone, and α-piperidone.

Among these, in particular, polyamides containing a dimer acid as a component are obtained by a common polycondensation of a dimer acid and a diamine. In this case, another dicarboxylic acid other than the dimer acid, such as adipic acid, azelaic acid, or sebacic acid, may be contained as a comonomer.

As the above-described thermoplastic resins (the phosphorus-containing polyester resin and the other thermoplastic resin), thermoplastic resins having a glass transition temperature of preferably 70° C. or lower, more preferably 50° C. or lower, and particularly preferably room temperature or lower are used. The reason for this is as follows. If the glass transition temperature is too high, the adhesiveness tends to decrease. Furthermore, a flexible adhesive layer cannot be obtained, resulting in a decrease in handleability of a laminate such as an adhesive sheet or a coverlay. In addition, thermoplastic resins having a glass transition temperature of 70° C. or lower are preferable because they are good in terms of reactivity with epoxy resins and flexibility, have a low water-absorbing property, and are good in terms of solder heat resistance and insulating property.

In the adhesive resin composition, a content ratio by mass of the above phosphorus-containing epoxy resin and/or the phosphorus-containing phenoxy resin to the above thermoplastic resin (a):((b)+(c)) is preferably 3:1 to 1:3.

When the content ratio of the phosphorus-containing epoxy resin and/or the phosphorus-containing phenoxy resin to the thermoplastic resin is too low, heat resistance and a mechanical strength cannot be satisfied. On the other hand, when the content ratio of the phosphorus-containing epoxy resin and/or the phosphorus-containing phenoxy resin is too high, the content ratio of the thermoplastic resin becomes relatively low, and thus flexibility decreases and a mechanical strength against bending tends to be insufficient.

(d) Curing Agent

The curing agent may be a compound that is used as a curing agent of a thermosetting resin. When the thermosetting resin is an epoxy resin, polyamine curing agents, acid anhydride curing agents, boron trifluoride-amine complex salts, imidazole curing agents, aromatic diamine curing agents, carboxylic acid curing agents, phenol resins, and the like are used.

Examples of the polyamine curing agents include aliphatic amine curing agents such as diethylenetriamine and tetraethylene tetramine; alicyclic amine curing agents such as isophorone diamine; aromatic amine curing agents such as diaminodiphenylmethane and phenylenediamine; and dicyandiamide. Examples of the acid anhydride curing agents include phthalic anhydride, pyromellitic dianhydride, trimellitic anhydride, and hexahydrophthalic anhydride.

The amount of curing agent mixed is appropriately determined in accordance with the epoxy equivalent of the epoxy resin.

Others

Besides the phosphorus-containing epoxy resin and/or the phosphorus-containing phenoxy resin, the thermoplastic resin, and the curing agent, the resin composition of the present invention preferably further contains a benzoxazine compound.

Benzoxazine compounds are subjected to ring-opening polymerization by heating and cured to provide cured products having good heat resistance and flame retardancy. Furthermore, benzoxazine compounds can also react with epoxy resins and phenoxy resins to form cured products having a high crosslinking density and having good flame retardancy and toughness. In cured products obtained by a reaction between a benzoxazine compound and the phosphorus-containing epoxy resin and/or the phosphorus-containing phenoxy resin, it is possible to form crosslinked products between the benzoxazine compound and the phosphorus-containing epoxy resin and/or the phosphorus-containing phenoxy resin. Thus, cured products having good flame retardancy can be formed and provided.

The content of the benzoxazine compound is preferably 5 to 25 parts by mass, and more preferably 10 to 20 parts by mass per 100 parts by mass of the resins. When the content of the benzoxazine compound exceeds 25 parts by mass, the resulting cured product becomes too hard, adhesiveness tends to decrease, and solder heat resistance also tends to decrease.

The benzoxazine compound used in the present invention is a condensate of an oxazine and a benzene ring, and is generally synthesized by allowing a phenol, an amine, and formaldehyde to react with each other. The benzoxazine compound may be any compound as long as the compound has a benzoxazine structure. The benzoxazine compound may be a multivalent oxazine compound having a plurality of benzoxazine rings in its molecule. In particular, a compound having benzoxazine structures at both ends thereof is preferably used.

Commercially available benzoxazine compounds may be used. For example, benzoxazines (P-d type, which is a both-end-type benzoxazine, and F-a type, which is a non-end-type benzoxazine) manufactured by Shikoku Chemicals Corporation, BXZ-1 (BS-BXZ), BXZ-2 (BF-BXZ), BXZ-3 (BA-BXZ) manufactured by Konishi Chemical Inc. Co., Ltd., and the like are available. Among these, from the standpoint of heat resistance, flame retardancy, and ease of handling, the P-d type, which has benzoxazine structures at both ends thereof, is preferable.

When the adhesive resin composition of the present invention contains a thermoplastic resin containing the phosphorus-containing polyester resin, and further contains the phosphorus-containing epoxy resin and/or the phosphorus-containing phenoxy resin, and the benzoxazine compound, which can form a cured product having good flame retardancy, a flame retardant need not be necessarily contained. However, mixing of a flame retardant is not eliminated, and a halogen-free flame retardant may be incorporated in order to further improve flame retardancy.

Examples of the halogen-free flame retardant that can be used in the present invention include phosphorus compounds such as phosphoric acid esters, phosphoric acid ester amides, phosphazenes, and 9,10-dihydro-9-oxa-10-phosphaphenanthrene-10-oxide. Among these, phosphazenes are preferably used from the standpoint of the phosphorus concentration and the solubility in a solvent. The term "phosphazenes" is a popular name of a group of compounds having a double bond and containing phosphorus and nitrogen as constituent elements. The phosphazene is not particularly limited as long as the compound has a phosphazene structure in its molecule. The phosphazene may be a cyclophosphazene having a cyclic structure, a linear polymer or oligomer obtained by conducting ring-opening polymerization of the cyclophosphazene.

In the case where a halogen-free flame retardant is incorporated, the adhesiveness decreases with an increase in the content. Thus, the content of the halogen-free flame retardant is preferably, at the maximum, 30 parts by mass or less per 100 parts by mass of the resins.

It should be noted that, preferably, a metal hydroxide (inorganic filler) such as magnesium hydroxide or aluminum hydroxide is not incorporated as the halogen-free flame retardant because such a metal hydroxide becomes a cause of a decrease in the adhesiveness.

[Preparation of Adhesive Resin Composition]

The adhesive resin composition of the present invention is prepared by mixing the components (a) to (d) described above, and if necessary, a benzoxazine compound and a halogen-free flame retardant.

The adhesive resin composition is preferably prepared so that the phosphorus content in the resin composition is 2.5% to 4% by mass. This is because, in particular, when the adhesive resin composition contains a benzoxazine compound, flame retardancy can be satisfied even at a phosphorus content of about 2.5% by mass.

In addition, a hardening accelerator, a silane coupling agent, a leveling agent, a defoaming agent, and the like may be incorporated as required. However, in the case where a phosphorus-containing epoxy resin is used and a benzoxazine compound is incorporated, addition of a hardening accelerator tends to shorten the pot life of the adhesive and decrease the adhesiveness. Therefore, a hardening accelerator should not be mixed in such a case. Furthermore, addition of inorganic filler tends to decrease the adhesiveness and migration characteristics, and thus, inorganic filler should not be mixed.

The adhesive resin composition of the present invention is usually dissolved in an organic solvent, and used as an adhesive solution. Examples of the organic solvent that can be used include toluene, methanol, ethanol, isopropanol, acetone, dioxolane, hexane, triethylamine, isobutyl acetate, butyl acetate, ethyl acetate, methyl ethyl ketone (MEK), methyl isobutyl ketone, Cellosolve, ethylene glycol, dimethylformamide (DMF), xylene, and N-methylpyrrolidone.

[Applications]

The adhesive resin composition of the present invention having the constitution described above is good in terms of solder heat resistance, satisfies flame retardancy of the V-0 class or the VTM-0 class in the UL-94 standard, has adhesiveness, and is good in terms of flexibility. Accordingly, the adhesive resin composition of the present invention can be suitably used for an adhesive layer of a laminate, such as an adhesive sheet or a coverlay, or a flexible printed wiring board.

According to the adhesive resin composition of the present invention, when an adhesive layer composed of the adhesive resin composition of the present invention is formed on a base film, the adhesive layer is laminated with a metal foil, and the resulting laminate is heated and pressed at 160° C. at 3 MPa/cm² for 40 minutes, an overflow of the adhesive resin composition from at least a portion of an outer peripheral end surface orthogonal to a lamination surface laminated with the metal foil can be 0.2 mm or less, preferably 0.1 mm or less, and more preferably 0.05 mm or less. Accordingly, the adhesive resin composition of the present invention can be suitably used when an overflow of an adhesive during curing by hot pressing causes a problem, for example, when an electrically connective terminal is formed or a through-hole in which flowing of an adhesive is strictly limited is formed.

Here, a flexible printed wiring board is produced by bonding an insulating film to a metal foil, with a cured product of the adhesive resin composition of the present invention therebetween, so as to include a plurality of layers. Specifically, the flexible printed wiring board can be formed by stacking a product (so-called three-layer substrate) prepared by applying the adhesive resin composition of the present invention onto an insulating film, drying the adhesive resin composition (to a semi-cured state), further stacking a metal foil, and then curing by heating; a product (so-called coverlay) prepared by applying the adhesive resin composition of the present invention onto an insulating film, drying the adhesive resin composition (to a semi-cured state), and covering an exposed surface of the resulting adhesive layer with an insulating film called separator; a product (so-called adhesive sheet) prepared by applying the adhesive resin composition of the present invention onto a separator or a base film, drying the adhesive resin composition (to a semi-cured state), and covering an exposed surface with a separator; and the like, and curing the resulting laminate by heating. Note that the separator is removed when the products are stacked.

Herein, "semi-cured state" refers to a state in which an adhesive resin composition has adhesiveness. The semi-cured state is formed by heating the adhesive resin composition of the present invention, for example, at 100° C. to 180° C. for 10 minutes to several hours, and further applying a pressure as required, and refers to a state in which a thermosetting resin (epoxy resin) cured by a reaction with a curing agent under heating and the uncured thermosetting resin are mixed. A suitable heating time varies depending on the components and the application (for example, a substrate, a coverlay, a bonding film, or the like) of the adhesive.

It is sufficient that the three-layer substrate of the present invention includes an insulating film and a metal foil bonded to at least one surface of the insulating film. The three-layer substrate may have a three-layer structure (so-called three-layer single-sided substrate) including an insulating film, an adhesive layer, and a metal foil layer. Alternatively, the three-layer substrate may have a five-layer structure (so-called three-layer double-sided substrate) including a metal foil, an adhesive layer, an electrically insulating film, an adhesive layer, and a metal foil layer.

Examples of the insulating film include a polyimide film, a polyester film, a polyetheretherketone film, and a polyphenylene sulfide film.

Examples of the metal foil include a copper foil and an aluminum foil. A copper foil is preferably used.

A coverlay film is a laminate used as a material that covers a surface of a flexible copper clad laminate, on which a wiring pattern is formed by processing a copper foil of the flexible copper clad laminate, so that the material protects the wiring. The coverlay film includes an insulating film and an adhesive layer in the semi-cured state, the adhesive layer being composed of the adhesive resin composition of the present invention and provided on the insulating film. A separator having a releasing property is usually bonded onto the adhesive layer.

The adhesive sheet includes a separator or a base film in some cases and an adhesive layer in a semi-cured state, the adhesive layer being composed of the adhesive resin composition of the present invention and provided on the separator or the base film, and is used for lamination of substrates or bonding of a reinforcing plate. The base film is selected in accordance with the application, and may be a heat-resistant, insulating film such as a polyimide film, or a prepreg sheet including a glass fiber reinforced plastic sheet, a nonwoven fabric or the like as a base.

EXAMPLES

Best modes for carrying out the present invention will now be described by way of Examples. The Examples do not limit the scope of the present invention.

[Preparation of Adhesive Resin Compositions]

An epoxy resin, a thermoplastic resin (blend resin of polyester resin:polyamide resin=2:3), a benzoxazine compound, a halogen-free flame retardant (phosphazene), and a curing agent were mixed in amounts shown in Table to prepare resin composition Nos. 1 to 4.

The prepared resin compositions were each dissolved and dispersed under stirring in a solvent containing methyl ethyl ketone and dimethylformamide to prepare adhesive solution Nos. 1 to 4 having a solid content concentration of 30% by weight.

As the epoxy resin, FX289 (phosphorus-containing epoxy resin) manufactured by Tohto Kasei Co., Ltd. was used. As the polyester resin, a phosphorus-containing polyester resin 1 (VYLON 337 manufactured by Toyobo Co., Ltd, weight-average molecular weight: 27,000), a phosphorus-containing polyester resin 2 (trial product, weight-average molecular weight: 14,000), a phosphorus-containing polyester resin 3 (VYLON 237 manufactured by Toyobo Co., Ltd, weight-average molecular weight: 30,000), or VYLON 300 (phosphorus-free polyester resin, weight-average molecular weight: 23,000) was used. As the benzoxazine compound, a benzoxazine (P-d type) manufactured by Shikoku Chemicals Corporation was used. As the halogen-free flame retardant (phosphazene), SPB100 manufactured by Otsuka Chemical Co., Ltd. was used. As the curing agent, trimellitic anhydride manufactured by Mitsubishi Gas Chemical Company, Inc. was used.

[Preparation and Evaluation of Flexible Printed Wiring Boards]

The following characteristics were measured and evaluated using the prepared adhesive solutions. Table shows the results.

(1) Flow Characteristics

Each of the adhesive solutions was applied onto a surface of a polyimide film having a thickness of 25 μm and having a hole 1a with a diameter of 1.5 mm so that the thickness of the adhesive after drying was 20 μm. The adhesive solution was dried at 150° C. for two minutes to form an adhesive layer in a semi-cured state. This adhesive layer in the semi-cured state was laminated with a rolled copper foil having a thickness of 18 μm, and the resulting laminate was then heated by hot pressing at a pressure of 3 MPa at 160° C. for 40 minutes. Thus, flexible printed wiring boards were prepared.

FIGURE includes schematic views showing the periphery of a hole 1a of a copper clad laminate after hot pressing. An adhesive layer 2 was formed on a polyimide film 1, and a copper foil 3 was bonded onto the adhesive layer 2. An overflow of the adhesive layer 2 in the portion of the hole 1a was observed to measure a distance d (mm) of a portion where the overflow of an adhesive from the edge of the hole of the polyimide film 1 to the copper foil was the maximum.

(2) Adhesiveness

For the flexible printed wiring boards prepared in (1), a peel strength (N/cm) was measured by drawing from the copper foil side to peel off the copper foil from the polyimide film at 23° C. in accordance with JIS C 6481.

(3) Solder Heat Resistance

For the flexible printed wiring boards prepared in (1), a test was conducted under the following conditions in accordance with JIS C 6471.

Temperature of solder bath: 280° C.
Immersion time: 60 seconds

The presence or absence of an abnormal appearance such as swelling of the adhesive layer was evaluated by visual observation. According to the results, when no abnormal appearance such as swelling was observed, the flexible printed wiring board was denoted as "O". When an abnormal appearance such as swelling or peeling was observed, the flexible printed wiring board was denoted as "X".

(4) Flame Retardancy

An evaluation test of flame retardancy was conducted in accordance with UL-94 using laminates each including the polyimide film and the semi-cured adhesive layer prepared in (1), the laminate being prepared by heating at 160° C. for 40 minutes without applying a pressure and without being laminated with a copper foil. A laminate that passed the above standard (V-0 class) was denoted as "O", and a laminate that did not pass the standard was denoted as "X".

TABLE

| | | No. | | | |
|---|---|---|---|---|---|
| | | 1 | 2 | 3 | 4 |
| Composition (parts by mass) | Polyamide | 30 | 30 | 30 | 30 |
| | Phosphorus-containing epoxy | 25 | 25 | 25 | 25 |
| | Phosphorus-containing polyester 1 | 20 | 0 | 0 | 0 |
| | Phosphorus-containing polyester 2 | 0 | 0 | 20 | 0 |
| | Phosphorus-containing polyester 3 | 0 | 0 | 0 | 20 |
| | Phosphorus-free polyester | 0 | 20 | 0 | 0 |
| | Benzoxazine | 10 | 10 | 10 | 10 |
| | Phosphazene | 15 | 15 | 15 | 15 |
| | Curing agent | 5 | 5 | 5 | 5 |
| Content in solid portion (%) | Phosphorus | 2.9 | 2.4 | 2.9 | 2.9 |
| | Phosphazene | 14.3 | 14.3 | 14.3 | 14.3 |
| Evaluations | Adhesiveness (N/cm) | 8 | 8.3 | 5.2 | 7.2 |
| | Solder heat resistance | O | O | O | O |
| | Flame retardancy | O | X | O | O |
| | Flow characteristics (mm) | 0.04 | 0.03 | 0.28 | 0.04 |

Phosphorus-containing polyester 1: weight-average molecular weight 27,000
Phosphorus-containing polyester 2: weight-average molecular weight 14,000
Phosphorus-containing polyester 3: weight-average molecular weight 30,000

In the case where the thermoplastic resin was a blend resin of the polyamide resin and the phosphorus-free polyester resin (No. 2), flame retardancy could not be satisfied. No. 3 was a case where a blend resin of the phosphorus-containing polyester resin having a weight-average molecular weight of 14,000 and the polyamide resin was used. Although flame retardancy could be satisfied, No. 3 was not suitable for a coverlay having a through-hole or the like because the overflow of the adhesive during hot pressing was significant. In contrast, in each of the adhesive resin composition containing a blend thermoplastic resin of the phosphorus-containing polyester resin having a weight-average molecular weight of 27,000 and the polyamide resin (No. 1) and the adhesive resin composition containing a blend thermoplastic resin of the phosphorus-containing polyester resin having a weight-average molecular weight of 30,000 and the polyamide resin (No. 4), all the adhesiveness, flame retardancy, solder heat resistance, and flow characteristics could be satisfied.

INDUSTRIAL APPLICABILITY

The adhesive resin composition of the present invention has good flexibility, adhesiveness, and flame retardancy. In addition, even when the adhesive resin composition of the present invention is cured at a high temperature under pressure, the amount of overflow of an adhesive is small. Accordingly, the adhesive resin composition of the present invention is useful not only for an adhesive layer of a flexible printed wiring board, a coverlay, or an adhesive sheet, but also, in particular, for a coverlay, an adhesive sheet, or the like having a through-hole.

The invention claimed is:

1. An adhesive resin composition comprising:
   a phosphorus-containing epoxy resin and/or a phosphorus-containing phenoxy resin;
   a phosphorus-containing polyester resin having a weight-average molecular weight of more than 20,000 and 50,000 or less;
   a polyamide thermoplastic resin, the polyamide having a glass transition temperature of 70° C. or lower, and having a reactive group that reacts with an epoxy group; and
   a curing agent, wherein:
   the content of the phosphorus-containing polyester resin in the thermoplastic resin is 30% to 50% by mass,
   a sum of an acid value and an amine value of the polyamide is 3 or more and 100 or less, and
   when an adhesive layer composed of the adhesive resin composition and having a thickness of 20 μm is formed on a base film, the adhesive layer is laminated with a metal foil, and the resulting laminate is heated and pressed at 160° C. at 3 MPa for 40 minutes, an overflow of the adhesive resin composition from at least a portion of an outer peripheral end surface orthogonal to a lamination surface laminated with the metal foil is 0.2 mm or less.

2. The adhesive resin composition according to claim 1, further comprising a benzoxazine compound in an amount of 5 to 25 parts by mass per 100 parts by mass of the resins.

3. The adhesive resin composition according to claim 1, wherein substantially no inorganic filler is mixed therein.

4. A laminate comprising:
   a base film; and
   an adhesive layer disposed on the base film and composed of the adhesive resin composition according to claim 1.

5. A flexible printed wiring board comprising the laminate according to claim 4.

* * * * *